United States Patent
Lim et al.

(10) Patent No.: US 8,968,846 B2
(45) Date of Patent: Mar. 3, 2015

(54) THERMAL TRANSFER FILM AND ORGANIC ELECTROLUMINESCENT DISPLAY MANUFACTURED USING THE SAME

(71) Applicants: Hyoung Tae Lim, Uiwang-si (KR); Kyoung Ku Kang, Uiwang-si (KR); Jung Hyo Lee, Uiwang-si (KR); Seong Heun Cho, Uiwang-si (KR); Si Kyun Park, Uiwang-si (KR); Se Hyun Park, Uiwang-si (KR)

(72) Inventors: Hyoung Tae Lim, Uiwang-si (KR); Kyoung Ku Kang, Uiwang-si (KR); Jung Hyo Lee, Uiwang-si (KR); Seong Heun Cho, Uiwang-si (KR); Si Kyun Park, Uiwang-si (KR); Se Hyun Park, Uiwang-si (KR)

(73) Assignee: Cheil Industries, Inc, Gumi-si, Kyeongsangbuk-do (KR)

( * ) Notice: Subject to any disclaimer, the term of this patent is extended or adjusted under 35 U.S.C. 154(b) by 13 days.

(21) Appl. No.: 13/729,569

(22) Filed: Dec. 28, 2012

(65) Prior Publication Data
US 2013/0171379 A1   Jul. 4, 2013

(30) Foreign Application Priority Data
Dec. 30, 2011 (KR) .................. 10-2011-0147624

(51) Int. Cl.
*B41M 5/46* (2006.01)
*H01L 51/00* (2006.01)
*H01J 9/20* (2006.01)
*H01L 51/56* (2006.01)

(52) U.S. Cl.
CPC .. *H01J 9/20* (2013.01); *B41M 5/46* (2013.01); *H01L 51/0013* (2013.01); *B41M 2205/38* (2013.01); *B41M 2205/40* (2013.01); *B41M 2205/30* (2013.01); *H01L 51/56* (2013.01); *Y02E 10/549* (2013.01)
USPC ........................................ 428/32.81; 156/234

(58) Field of Classification Search
CPC ............... B41M 5/46; B41M 2205/30; B41M 2205/38; B41M 2205/40; H01L 51/0013
USPC ........................................ 428/32.81; 156/234
See application file for complete search history.

(56) References Cited

U.S. PATENT DOCUMENTS 5,715,511 A   2/1998   Aslam et al.

FOREIGN PATENT DOCUMENTS

| CN | 1656196 A | 8/2005 |
| JP | 2000-135862 A | 5/2000 |
| JP | 2004-510289 A | 4/2004 |
| WO | WO-02-22374 A1 | 3/2002 |

OTHER PUBLICATIONS

Korean Office Action in corresponding Korean Patent Application No. 10-2011-0147624 issued Nov. 22, 2013.

*Primary Examiner* — Bruce H Hess
(74) *Attorney, Agent, or Firm* — Lee & Morse, P.C.

(57) ABSTRACT

A thermal transfer film and an organic electroluminescent display manufactured using the thermal transfer film, the thermal transfer film including a base layer; and a transfer enhancement layer having a surface energy of about 25 dyne/cm or less.

19 Claims, 2 Drawing Sheets

THERMAL TRANSFER FILM AND ORGANIC ELECTROLUMINESCENT DISPLAY MANUFACTURED USING THE SAME

CROSS-REFERENCE TO RELATED APPLICATION

The present application claims priority under 35 U.S.C. §119 to Korean Patent Application No. 10-2011-0147624, filed on Dec. 30, 2011, in the Korean Intellectual Property Office, and entitled: "Thermal Transfer Film and Organic Electroluminescent Display Manufactured Using the Same," which is incorporated by reference herein in its entirety.

BACKGROUND

1. Field of the Invention

Embodiments relate to a thermal transfer film and an organic electroluminescent display manufactured using the same.

2. Description of the Related Art

Thickness reduction and high performance has may be desirable in various fields including optics, displays, semiconductors, and biotechnology. Accordingly, forming wires or functional thin films for each component in a smaller and more uniform pattern may be desirable. Thus, laser-induced thermal imaging may be used. In such a process, a light-to-heat conversion (LTHC) layer may absorb light of a certain wavelength range and convert the light into heat such that a transfer material stacked on the LTHC layer may be transferred to a receptor.

SUMMARY

Embodiments are directed to a thermal transfer film and an organic electroluminescent display manufactured using the same.

The embodiments may be realized by providing a thermal transfer film including a base layer; and a transfer enhancement layer having a surface energy of about 25 dyne/cm or less.

The thermal transfer film may further include a transfer layer stacked on the transfer enhancement layer, the transfer layer including an organic electroluminescent material layer.

The transfer enhancement layer may have a peel strength of about 600 gf/inch or less.

The transfer enhancement layer may have a water contact angle of about 80° or more.

The transfer enhancement layer may have an n-hexadecane contact angle of about 25° or more.

The transfer enhancement layer may be prepared from a composition including a UV-curable fluorine compound, a UV-curable siloxane compound, or a mixture thereof.

The UV-curable fluorine compound may include a compound represented by Formula 1:

$(CH_2=CR^1COO)_nR^f,$  [Formula 1]

wherein, in Formula 1, n is an integer of 1 or more; $R^1$ is hydrogen or a $C_1$ to $C_5$ straight or branched alkyl group; and $R^f$ is a fluoroalkyl group, a fluoroalkylene group, a perfluoroalkyl group, or a perfluoroalkylene group), and wherein the UV-curable siloxane compound includes a (meth)acrylic group-containing polyether-modified dialkyl polysiloxane.

A light-to-heat conversion (LTHC) layer may be stacked on the base layer, the transfer enhancement layer being in the LTHC layer at a surface of the LTHC layer.

The transfer enhancement layer and the LTHC layer may have a monolayer structure.

The LTHC layer including the transfer enhancement layer may be prepared from a composition including a UV-curable resin, a polyfunctional monomer, a photopolymerization initiator, a light-to-heat conversion material, and at least one of a UV-curable fluorine compound or a UV-curable siloxane compound.

The LTHC layer including the transfer enhancement layer may be prepared from a composition including, in terms of solid content about 25 wt % to about 80 wt % of a UV-curable resin, about 10 wt % to about 40 wt % of a polyfunctional monomer, about 5 wt % to about 30 wt % of a light-to-heat conversion material, about 0.1 wt % to about 10 wt % of a photopolymerization initiator, and about 0.1 wt % to about 5.0 wt % of at least one of a curable fluorine compound or a curable siloxane compound.

An LTHC layer may be stacked on the base layer, and an inter layer may be stacked on the LTHC layer, the transfer enhancement layer being in the inter layer at a surface layer of the inter layer.

The transfer enhancement layer and the inter layer may have a monolayer structure.

The inter layer including the transfer enhancement layer may be prepared from a composition including a UV-curable resin, a polyfunctional monomer, a photopolymerization initiator, and at least one of a UV-curable fluorine compound or a UV-curable siloxane compound.

The inter layer including the transfer enhancement layer may be prepared from a composition including, in terms of solid content about 40 wt % to about 80 wt % of a UV-curable resin, about 10 wt % to about 50 wt % of a polyfunctional monomer, about 1 wt % to about 10 wt % of a photopolymerization initiator, and about 0.1 wt % to about 5.0 wt % of at least one of a curable fluorine compound or a curable siloxane compound.

The thermal transfer film may further include at least one of an LTHC layer or an inter layer, the at least one of the LTHC layer or the inter layer being between the transfer enhancement layer and the base layer.

The transfer enhancement layer may be prepared from a composition including a fluorine modified UV-curable resin, photopolymerization initiator, and at least one of a UV-curable fluorine compound or a UV-curable siloxane compound.

The transfer enhancement layer may be prepared from a composition including, in terms of solid content about 50 wt % to about 80 wt % of a fluorine modified UV-curable resin, about 1 wt % to about 10 wt % of a photopolymerization initiator, and about 19 wt % to about 40 wt % of a curable fluorine compound.

The transfer enhancement layer may have a thickness of about 0.1 nm to about 10,000 nm.

The embodiments may also be realized by providing an organic electroluminescent display manufactured using the thermal transfer film according to an embodiment.

BRIEF DESCRIPTION OF DRAWINGS

Features will become apparent to those of skill in the art by describing in detail exemplary embodiments with reference to the attached drawings in which.

DETAILED DESCRIPTION

Figure 1:
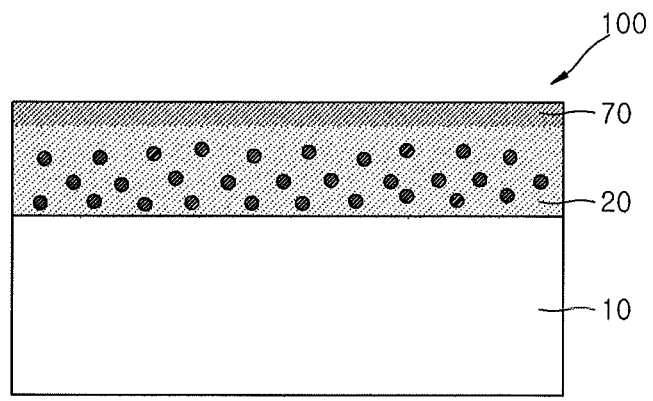
FIGS. 1 to 4 illustrate sectional views of thermal transfer films according to the embodiments.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout An embodiment provides a thermal transfer film. The thermal transfer film may include a base layer and a transfer enhancement layer. The transfer enhancement layer may have a surface energy of about 25 dyne/cm or less. The transfer enhancement layer may be a coating layer on or a surface layer in the thermal transfer film.

One type of thermal transfer film may have a structure in which a light-to-heat conversion (LTHC) layer is stacked on a base layer. A transfer layer (including, e.g., an organic electroluminescent material or the like) may be stacked on the LTHC layer. Another type of thermal transfer film may have a structure in which the base layer, the LTHC layer, and an inter layer are sequentially stacked. The transfer layer may be stacked on the inter layer. The LTHC layer or the inter layer may have a surface energy of about 30 dyne/cm to about 40 dyne/cm. As a result, the organic electroluminescent material may be partially or entirely peeled off while peeling the thermal transfer film after thermal transfer via the thermal transfer film.

The transfer enhancement layer according to an embodiment may have a surface energy of about 25 dyne/cm or less. The transfer layer (including, e.g., an organic electroluminescent material or the like) may be further stacked on the transfer enhancement layer. The transfer enhancement layer may have a surface energy lower than the LTHC layer or the inter layer, and thus an adhesive strength between the thermal transfer film and the organic electroluminescent material may be lowered, thereby preventing some or all of the organic electroluminescent material from being peeled off during a process of peeling the thermal transfer film after the organic electroluminescent material is thermally transferred.

In an implementation, the transfer enhancement layer may have a surface energy of about 10 dyne/cm to about 25 dyne/cm, e.g., about 10 dyne/cm to about 18 dyne/cm or about 14 dyne/cm to about 18 dyne/cm.

The surface energy of the transfer enhancement layer may be measured by a suitable method. For example, the surface energy may be obtained by measuring a contact angle between a droplet of distilled water (or n-hexadecane) and a surface when the droplet of distilled water (or n-hexadecane) falls on the surface, i.e., the transfer enhancement layer to be measured with regard to the surface energy. Then, the surface energy may be calculated by the "Girifalco-Good-Fowkes-Young equation" (using the contact angle of one kind of fluid one kind of solid) using the contact angle. Alternatively, the surface energy may be obtained by applying a material (e.g., ACCU DYNE TESTER), the surface energy of which is known, to the surface, the surface energy of which is to be measured, and then comparing a wettability of the material.

The transfer enhancement layer may have a water contact angle of about 80° or higher. Within this range, peeling off of the organic electroluminescent material after the organic electroluminescent material is thermally transferred and patterned may be reduced and/or prevented. In an implementation, the transfer enhancement layer may have a water contact angle of about 88° to about 180°, e.g., about 95° to about 180° or about 95° to about 103°.

The transfer enhancement layer may have an n-hexadecane contact angle of about 25° or higher. Within this range, peeling off of the organic electroluminescent material after the organic electroluminescent material is thermally transferred and patterned may be reduced and/or prevented. In an implementation, the transfer enhancement layer may have an n-hexadecane contact angle of about 30° to about 180°, e.g., about 35° to about 90° or about 35° to about 55°.

The transfer enhancement layer may have a peel strength of about 600 gf/inch or less, e.g., about 5 gf/inch to about 500 gf/inch or about 215 gf/inch to about 470 gf/inch.

To measure the peel strength, a specimen may be prepared by attaching a 25 mm wide adhesive strength evaluation tape (Nitto Tape 31D) to a 30 cm wide transfer enhancement layer using a roller at a load of 10 kgf. Then, the specimen may be left at 25° C. for 3 days. Then, the peel strength of the specimen may be measured using a 14FW Tester (Heidon) at a peeling speed of 300 mm/min and a peeling angle of 180°.

The transfer enhancement layer may have a thickness of about 0.1 nm to about 10,000 nm, e.g., about 1 nm to about 100 nm. Within this range, a decrease in surface energy and a decrease in adhesion to the organic electroluminescent material may be maximized.

The transfer enhancement layer may be formed of or prepared from a composition including a curable fluorine compound, a curable siloxane compound, or a mixture thereof. The curable fluorine compound and/or the curable siloxane compound may help lower the surface energy of the transfer enhancement layer.

The curable fluorine compound and/or the curable siloxane compound may be a UV curable compound capable of being cured by ultraviolet light, or a heat curable compound capable of being cured by heat. In an implementation, each of the curable fluorine compound and the curable siloxane compound may be a UV curable compound.

The curable fluorine compound and/or the curable siloxane compound may have mono- or higher functional groups used for a curing reaction, e.g., bi- or higher functional groups. For example, the curable fluorine compound and/or the curable siloxane compound may be a bi- or higher polyfunctional (meth)acrylate. The polyfunctional (meth)acrylate may include, e.g., an epoxy group, a hydroxyl group, an amino group, or a sulfonic acid group.

The curable fluorine compound may include a fluorine modified polyfunctional (meth)acrylate, which may be prepared by reacting a perfluoro group-containing compound with a polyfunctional (meth)acrylate.

For example, the curable fluorine compound may be a polyfunctional (meth)acrylate, which is prepared by reacting a perfluoro group-containing compound, such as perfluoropolyol, perfluoro polyether polyol, carboxylic acid-containing perfluoro polyether dibasic acid, and epoxy group-containing perfluoro polyether epoxy compounds, with a polyfunctional (meth)acrylate, such as carboxylic acid-containing modified (meth)acrylate, epoxy group-containing (meth)acrylate, and isocyanate group-containing (meth)acrylate compounds.

In an implementation, the curable fluorine compound may include a compound represented by Formula 1, below.

$$(CH_2=CR^1COO)_n R^f$$  [Formula 1]

In Formula 1, n may be an integer of 1 or more; $R^1$ may be hydrogen or a $C_1$ to $C_5$ straight or branched alkyl group; and $R^f$ may be a fluoroalkyl group, a fluoroalkylene group, a perfluoroalkyl group, or a perfluoroalkylene group.

In an implementation, in Formula 1, n may be an integer of 2 or more, e.g., an integer from 2 to 20.

In an implementation, in Formula 1, $R^f$ may be a $C_2$ to $C_{50}$ straight or branched fluoroalkyl group, a $C_2$ to $C_{50}$ straight or branched fluoroalkylene group, a $C_2$ to $C_{50}$ straight or branched perfluoroalkyl group, or a $C_2$ to $C_{50}$ straight or branched perfluoroalkylene group.

In an implementation, in Formula 1, $R^f$ may have a structure of one of Formulae (a) to (e):

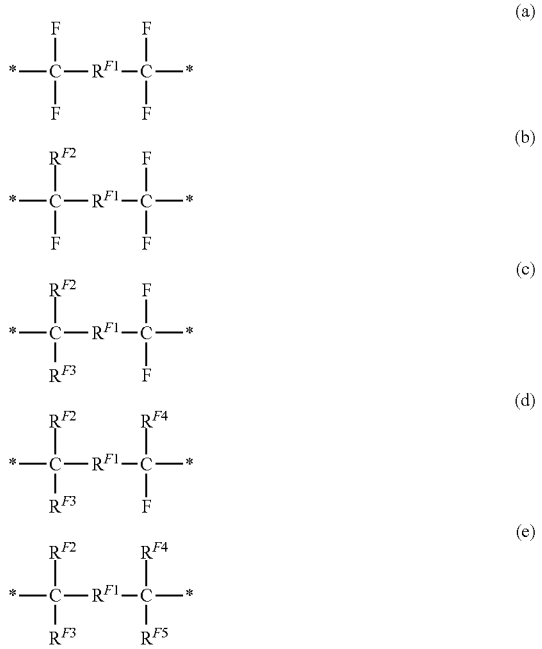

In Formulae (a) to (e), $R^{F1}$ may be a $C_1$ to $C_{10}$ straight or branched fluoroalkylene group or perfluoroalkylene group; and $R^{F2}$, $R^{F3}$, $R^{F4}$, and $R^{F5}$ may be H, a $C_1$ to $C_{14}$ straight or branched fluoroalkyl group, or a $C_1$ to $C_{14}$ straight or branched perfluoroalkyl group.

The curable siloxane compound may help increase a water contact angle of the transfer enhancement layer and may help decrease surface energy of the transfer enhancement layer.

The curable siloxane compound may include a (meth) acrylic group. For example, the curable siloxane compound may be (meth)acrylic group-containing polyether-modified dialkylpolysiloxane.

The curable siloxane compound may be prepared by a suitable method or may be commercially obtained. For example, the curable siloxane compound may be a polyether modified dimethylpolysiloxane (BYK3700, BYK Chemie Co., Ltd.).

The curable fluorine compound, the curable siloxane compound, or the mixture thereof may be present in the composition for the transfer enhancement layer in an amount of about 0.1 wt % to about 10.0 wt %, e.g., about 0.1 wt % to about 5.0 wt % or about 0.5 wt % to about 3.0 wt %, in terms of solid content.

In an implementation, the transfer enhancement layer may be provided to the thermal transfer film by forming two or more chemically different layers in the LTHC layer or the inter layer of the thermal transfer film, through migration of a certain material in thickness direction of the LTHC layer or the inter layer, based on a difference in inherent surface energy of the material.

Particularly, the siloxane compound and the fluorine compound have lower surface energy than UV-curable resins and polyfunctional monomers. Thus, when the composition comprising the UV-curable resins, polyfunctional monomers and at least one of the siloxane compound and the fluorine compound is coated and cured to make a layer, the siloxane compound and the fluorine compound migrate upwards in thickness direction of the layer to form a coating layer or a surface layer e.g. a transfer enhancement layer, and the UV-curable resins and the polyfunctional monomers form a remains of a LTHC layer or inter layer, due to difference of surface energy.

In an implementation, the transfer enhancement layer may be provided to the thermal transfer film by being additionally stacked on the LTHC layer or the inter layer of the thermal transfer film.

The transfer enhancement layer may become a part of the LTHC layer or inter layer, e.g., a surface layer thereof, in the thermal transfer film. In an implementation, the transfer enhancement layer may be stacked on the LTHC layer or inter layer in the thermal transfer film.

In an implementation, the transfer enhancement layer may be the surface layer of the LTHC layer as a part of the LTHC layer of the thermal transfer film.

FIG. 1 illustrates a sectional view of a thermal transfer film according to an embodiment. Referring to FIG. 1, the thermal transfer film 100 may include a base layer 10 and an LTHC layer 20 stacked on the base layer 10, in which a transfer enhancement layer 70 is formed at a surface of the LTHC layer 20, e.g., continuous with the LTHC layer 20. The LTHC layer 20 and the transfer enhancement layer 70 may be simultaneously formed to provide a monolayer structure. The "monolayer structure" may refer to a structure in which an adhesive layer is not included between the LTHC layer and the transfer enhancement layer and that the LTHC layer and the transfer enhancement layer are distinguished by a difference of components included in the LTHC layer and the transfer enhancement layer.

The LTHC layer and the transfer enhancement layer may be simultaneously formed. The LTHC layer and the transfer enhancement layer may be formed of or prepared from a composition, which includes a UV-curable resin; a polyfunctional monomer; a curable fluorine compound, a curable siloxane compound or a mixture thereof; a light-to-heat conversion material; and a photopolymerization initiator.

The UV-curable resin may be a mono- or higher functional, e.g., a bi- or higher functional or a hexa- or higher functional, oligomer or pre-polymer.

The UV-curable resin may be a (meth)acrylate resin of a polyfunctional compound having a relatively low molecular weight, e.g., a polyurethane resin, a polyester resin, a polyether resin, an acrylic resin, an epoxy resin, an alkyd resin, a spiroacetal resin, a polybutadiene resin, a polythiolpolyene resin, a polyhydric alcohol, or the like.

Examples of the UV-curable resin may include polyurethane(meth)acrylate, epoxy(meth)acrylate, polymethyl (meth)acrylate, poly(meth)acrylate of polyol, di(meth)acrylate of bisphenol A-diglycidyl ether, polyester (meth)acrylates obtained through esterification of polyhydric alcohol, polycarboxylic acid or anhydrides thereof with (meth)acrylic acid, polysiloxane poly(meth)acrylate, and the like.

The UV-curable resin may also include a fluorinated UV curable resin. For example, the fluorinated UV curable resin may include a fluorinated (meth)acrylate oligomer or a prepolymer or a fluorine containing compound such as fluorine-containing epoxy(meth)acrylate, fluorine-containing alkoxysilane, or the like.

In an implementation, the fluorinated UV-curable resin may include an oligomer or pre polymer of 2-(perfluorodecyl)ethyl (meth)acrylate, 3-perfluorooctyl-2-hydroxypropyl (meth)acrylate, 3-(perfluoro-9-methyldecyl)-1,2-epoxypropane, (meth)acrylic acid-2,2,2-trifluoroethyl, (meth)acrylic acid-2-trifluoromethyl, or the like.

The UV-curable resins may be used alone or in combination of two or more thereof.

The polyfunctional monomer may be, e.g., a bi-, tri-, tetra-, penta-, or hexa-functional monomer. In an implementation, the polyfunctional monomer may be a tri-functional monomer.

The polyfunctional monomer may be a polyfunctional (meth)acrylate, e.g., a polyfunctional (meth)acrylate of polyhydric alcohol, a fluorine modified polyfunctional (meth) acrylate, or a mixture thereof.

In an implementation, the polyfunctional (meth)acrylate may include a hydroxyl group.

Examples of polyfunctional (meth)acrylates may include pentaerythritol tetra(meth)acrylate, glycerol tri(meth)acrylate, ethylene glycol di(meth)acrylate, neopentyl glycol di(meth)acrylate, hexanediol di(meth)acrylate, trimethylolpropane di(meth)acrylate, dipentaerythritol hexa(meth)acrylate, trimethylolpropane tri(meth)acrylate, dipentaerythritol penta(meth)acrylate, pentaerythritol tri(meth)acrylate, pentaerythritol tetra(meth)acrylate, ditrimethylolpropane tetra (meth)acrylate, tris(2-hydroxy ethyl)isocyanurate tri(meth) acrylate, cyclodecane dimethanol di(meth)acrylate, and mixtures thereof.

The fluorine modified polyfunctional (meth)acrylate may be obtained by modifying the polyfunctional (meth)acrylate monomer with a fluorine compound.

The light-to-heat conversion material may include, e.g., dyes, pigments, or mixtures thereof. The dyes, pigments, or mixtures thereof may convert light energy into thermal energy upon radiation of light at wavelengths of about 400 nm to about 1,500 nm.

For example, the dyes or pigments may be selected from the group of diimmonium dyes, metal-complex dyes, naphthalocyanine dyes, phthalocyanine dyes, polymethine dyes, anthraquinone dyes, porphyrin dyes, metal-complex-shaped cyanine dyes, carbon black pigments, metal oxide pigments, metal sulfide pigments, graphite pigments, and mixtures thereof.

The photopolymerization initiator may form the LTHC layer by curing the UV-curable resin, the polyfunctional monomer, the UV-curable fluorine compound, and/or the UV-curable siloxane compound.

A suitable photopolymerization initiator may be used. In an implementation, the photopolymerization initiator may be, e.g., a benzophenone compound such as 1-hydroxycyclohexyl phenyl ketone.

The LTHC layer (having the transfer enhancement layer formed as the surface layer thereof) may be formed of a composition, which includes, in terms of solid content, about 25 wt % to about 80 wt % of the UV-curable resin; about 10 wt % to about 40 wt % of the polyfunctional monomer; about 0.1 wt % to about 5.0 wt % of the curable fluorine compound, the curable siloxane compound, or the mixture thereof; about 5 wt % to about 30 wt % of the light-to-heat conversion material; and about 0.1 wt % to about 10 wt % of the photopolymerization initiator.

In an implementation, the LTHC layer (having the transfer enhancement layer formed as the surface layer thereof) may be formed of a composition, which includes, in terms of solid content, about 45 wt % to about 70 wt % of the UV-curable resin; about 10 wt % to about 30 wt % of the polyfunctional monomer; about 0.5 wt % to about 3.0 wt % of the curable fluorine compound, the curable siloxane compound or the mixture thereof; about 10 wt % to about 20 wt % of the light-to-heat conversion material; and about 1 wt % to about 5 wt % of the photopolymerization initiator.

The composition may further include a solvent. The solvent may include, e.g., methylethylketone, propylene glycol monomethyl ether acetate, or mixtures thereof.

The LTHC layer (having the transfer enhancement layer formed as the surface layer thereof) may be prepared by coating the composition on the base layer, and drying for about 1 minute to 10 minutes at about 50° C. to 130° C. In an implementation, the LTHC layer may be further subjected to curing at a light intensity of about 100 mJ/cm$^2$ to about 1,000 mJ/cm$^2$.

The LTHC layer (having the transfer enhancement layer formed as the surface layer thereof) may have a thickness of, e.g., about 1 μm to about 10 μm.

Alternatively, the LTHC layer and the inter layer may be sequentially stacked on the base layer in the thermal transfer film, and the transfer enhancement layer may be formed on or in the surface layer of the inter layer as a part of the inter layer.

On the surface of the LTHC layer of the thermal transfer film, the inter layer and the transfer enhancement layer may be simultaneously formed to constitute a monolayer structure. The "monolayer structure" may refer to a structure in which adhesive layers between the inter layer and the transfer enhancement layer are not included, and that the inter layer and the transfer enhancement layer are distinguished by a difference of components included in the inter layer and the transfer enhancement layer.

Figure 2:
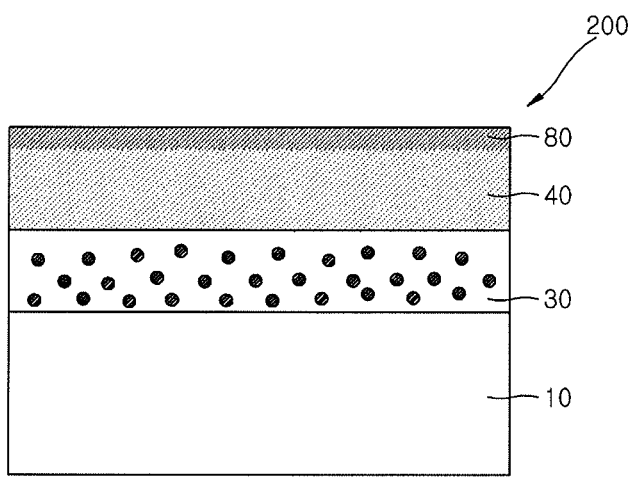

FIG. 2 illustrates a sectional view of a thermal transfer film according to an embodiment. Referring to FIG. 2, a thermal transfer film 200 may include a base layer 10, an LTHC layer 30 stacked on the base layer 10, and an inter layer 40 stacked on the LTHC layer 30, in which a transfer enhancement layer 80 may be formed at or in a surface layer of the inter layer 40, e.g., continuous with the inter layer 40. For example, the inter layer 40 and the transfer enhancement layer 80 may be simultaneously formed to have a monolayer structure.

The LTHC layer may be a suitable LTHC layer which may be typically included in the thermal transfer film. For example, the LTHC layer may be formed of a composition that includes a UV-curable resin; a polyfunctional monomer; a light-to-heat conversion material; and a photopolymerization initiator, as described above.

The LTHC layer may be formed of a composition, which includes, e.g., in terms of solid content, 25 wt % to about 80 wt % of the UV-curable resin; about 10 wt % to about 40 wt % of the polyfunctional monomer; about 5 wt % to about 30 wt % of the light-to-heat conversion material; and about 0.1 wt % to about 10 wt % of the photopolymerization initiator.

The composition for the LTHC layer may further include a solvent. The solvent may include, e.g., methylethylketone, propylene glycol monomethyl ether acetate, or mixtures thereof. The LTHC layer may have a thickness of about 1 μm to about 10 μm, e.g., about 2 μm to about 5 μm. The transfer enhancement layer and the inter layer may be simultaneously formed.

The inter layer (having the transfer enhancement layer formed as a surface layer thereof) may be formed of a composition, which includes, e.g., a UV-curable resin; a polyfunctional monomer; a curable fluorine compound, a curable siloxane compound or a mixture thereof; and a photopolymerization initiator.

Details of the UV-curable resin, polyfunctional monomer, curable fluorine compound, curable siloxane compound, and photopolymerization initiator may be the same as those described above.

The inter layer (having the transfer enhancement layer formed as the surface layer thereof) may be formed of a composition, which includes, e.g., in terms of solid content, about 40 wt % to about 80 wt % of the UV-curable resin; about 10 wt % to about 50 wt % of the polyfunctional monomer; about 0.1 wt % to about 5.0 wt % of the curable fluorine compound, the curable siloxane compound or the mixture thereof; and about 1 wt % to about 10 wt % of the photopolymerization initiator.

In an implementation, the inter layer (having the transfer enhancement layer formed as the surface layer thereof) may be formed of a composition, which includes, e.g., in terms of solid content, about 50 wt % to about 75 wt % of the UV-curable resin; about 20 wt % to about 40 wt % of the polyfunctional monomer; about 0.5 wt % to about 3.0 wt % of the curable fluorine compound, the curable siloxane compound or the mixture thereof; and about 1 wt % to about 7 wt % of the photopolymerization initiator.

The composition may further include a solvent. The solvent may include, e.g., methylethylketone, propylene glycol monomethyl ether acetate, or mixtures thereof.

The inter layer (having the transfer enhancement layer formed as the surface layer thereof) may be prepared by, e.g., coating the composition on the LTHC layer, and drying for about 1 minute to about 10 minutes at about 50° C. to about 130° C., followed by curing at a light intensity from about 100 mJ/cm² to about 1,000 mJ/cm².

The inter layer (having the transfer enhancement layer formed as the surface layer thereof) may have a thickness of about 1 μm to about 10 μm, e.g., about 2 μm to about 5 μm, without being limited thereto.

Alternatively, the LTHC layer may be formed or the LTHC layer and the inter layer may be formed between the base layer and the transfer enhancement layer in the thermal transfer film. With this structure, the transfer enhancement layer may help improve thermal transfer efficiency while reducing and/or preventing peeling of the organic electroluminescent material.

Figure 3:
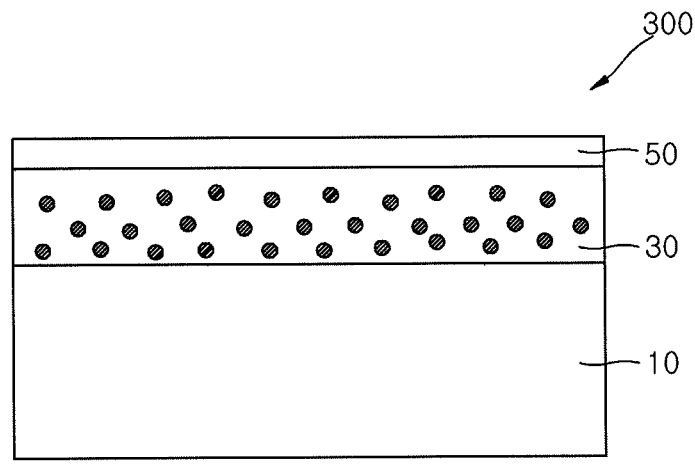
Figure 4:
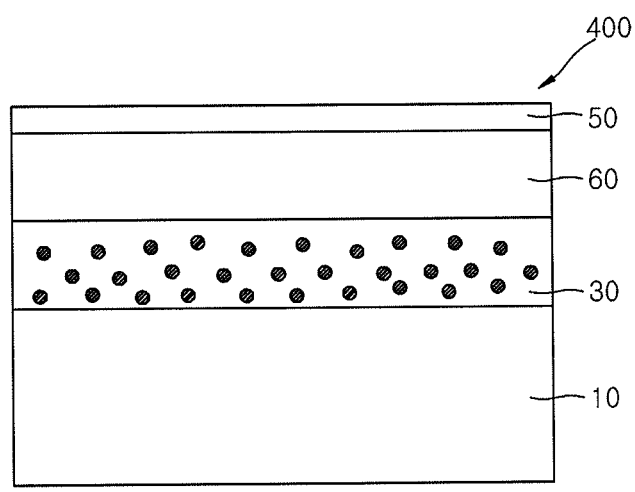

FIGS. 3 and 4 illustrate sectional views of thermal transfer films according to an embodiment.

Referring to FIG. 3, a thermal transfer film 300 may include a base layer 10, an LTHC layer 30 stacked on the base layer 10, and a transfer enhancement layer 50 stacked on the LTHC layer 30.

Referring to FIG. 4, a thermal transfer film 400 may include a base layer 10, an LTHC layer 30 stacked on the base layer 10, an inter layer 60 stacked on the LTHC layer 30, and a transfer enhancement layer 50 stacked on the inter layer 60.

In FIGS. 3 and 4, the transfer enhancement layer may be stacked separately from the LTHC layer and the inter layer.

The LTHC layer may be a suitable LTHC layer which may be typically included in the thermal transfer film. For example, the LTHC layer may be formed of a composition that includes a UV-curable resin; a polyfunctional monomer; a light-to-heat conversion material; and a photopolymerization initiator, as described above.

The LTHC layer may be formed of a composition, which includes, e.g., in terms of solid content, about 25 wt % to about 80 wt % of the UV-curable resin; about 10 wt % to about 40 wt % of the polyfunctional monomer; about 5 wt % to about 30 wt % of the light-to-heat conversion material; and about 0.1 wt % to about 10 wt % of the photopolymerization initiator.

The composition for the LTHC layer may further include a solvent. The solvent may include, e.g., methylethylketone, propylene glycol monomethyl ether acetate, or mixtures thereof. The LTHC layer may have a thickness of about 1 μm to about 10 μm, e.g., about 2 μm to about 5 μm.

The inter layer may be a suitable inter layer typically included in the thermal transfer film. For example, the inter layer may be formed of a composition that includes, e.g., a UV-curable resin; a polyfunctional monomer; and a photopolymerization initiator, as described above.

The inter layer may be formed of a composition, which includes, e.g., in terms of solid content, about 40 wt % to about 80 wt % of the UV-curable resin; about 10 wt % to about 50 wt % of the polyfunctional monomer; and about 1 wt % to about 10 wt % of the photopolymerization initiator.

In an implementation, the inter layer may be formed of a composition, which includes, e.g., in terms of solid content, about 60 wt % to about 76 wt % of the UV-curable resin; about 20 wt % to about 30 wt % of the polyfunctional monomer; and about 1 wt % to about 5 wt % of the photopolymerization initiator.

In an implementation, the inter layer may include, e.g., a polymer film, a metal layer, an inorganic layer (an inorganic oxide (for example, silica, titania, and/or other metal oxides) layer formed via sol-gel deposition or vapor deposition), and/or an organic/inorganic composite layer. The organic material may include, e.g., thermosetting materials, thermoplastic materials, or mixtures thereof.

The inter layer may have a thickness of about 1 μm to about 10 e.g., about 2 μm to about 5 μm.

The transfer enhancement layer may be formed of a composition, which includes, e.g., a UV-curable resin; a curable fluorine compound; a curable siloxane compound; and a photopolymerization initiator.

In an implementation, the transfer enhancement layer may be formed of a composition, which includes, e.g., a fluorine-modified UV-curable resin; a curable fluorine compound; and a photopolymerization initiator.

The UV-curable resin, curable fluorine compound, curable siloxane compound, and photopolymerization initiator may be the same as described above.

The fluorine modified UV-curable resin may be obtained by modifying the UV-curable resin with fluorine. For example, the fluorine modified UV-curable resin may include a fluorinated (meth)acrylate oligomer or a pre-polymer.

For example, the fluorine modified UV-curable resin may be a fluorine-containing compound, such as fluorine-containing epoxy(meth)acrylate compounds, fluorine-containing alkoxysilane compounds, or the like. Examples of the fluorine modified UV-curable resin may include oligomer or pre-polymer of 2-(perfluorodecyl)ethyl (meth)acrylate, 3-perfluorooctyl-2-hydroxypropyl(meth)acrylate, 3-(perfluoro-9-methyldecyl)-1,2-epoxypropane, (meth)acrylic acid-2,2,2-trifluoroethyl, (meth)acrylic acid-2-trifluoromethyl, and the like.

The transfer enhancement layer may be formed of a composition, which includes, e.g., in terms of solid content, about 50 wt % to about 80 wt % of the fluorine modified UV-curable resin; about 19 wt % to about 40 wt % of the curable fluorine compound; and about 1 wt % to about 10 wt % of the photopolymerization initiator.

In an implementation, the transfer enhancement layer may be formed of a composition, which includes, e.g., in terms of solid content, about 60 wt % to about 75 wt % of the fluorine modified UV-curable resin; about 24 wt % to about 35 wt % of the curable fluorine compound; and about 1 wt % to about 5 wt % of the photopolymerization initiator.

The composition may further include a solvent. The solvent may include, e.g., methylethylketone, propylene glycol monomethyl ether acetate, or mixtures thereof.

The transfer enhancement layer may be prepared by, e.g., coating the composition for the transfer enhancement on the LTHC layer or the inter layer, drying for about 1 to 10 minutes at about 50° C. to about 130° C., followed by curing at a light intensity from about 100 mJ/cm$^2$ to about 1000 mJ/cm$^2$. The transfer enhancement layer may have a thickness of, e.g., about 1 nm to about 500 nm.

A suitable base layer that has good adhesion with the LTHC layer and is capable of controlling heat transfer to the LTHC layer and other layers may be used.

The base layer may be formed of a transparent polymer film. For example, the base layer may be formed of at least one selected from the group of polyester, polyacryl, polyepoxy, polyethylene, polypropylene, and polystyrene polymer films. In an implementation, the base layer may be mainly formed of a polyester film, a polyethylene terephthalate (PET) film, or a polyethylene naphthalate film.

The base layer may have a thickness of about 30 μm to 300 μm. In an implementation, the base layer may have a thickness of about 75 μm to 125 μm.

In addition, the transfer layer may be formed on the transfer enhancement layer.

Transfer Layer

The transfer layer may include at least one layer for transferring a transfer material, e.g., an organic electroluminescent material, to a receptor. The transfer layer may be formed of organic, inorganic, metal, or other materials, which include electroluminescent materials (including organic electroluminescent materials) or electrically active materials. The transfer layer may be uniformly coated on the photothermal conversion layer or thermal transfer film via evaporation, sputtering, or solvent coating. Alternatively, the transfer layer may be coated in a predetermined pattern through digital printing, lithography, evaporation, or sputtering through a mask.

The transfer layer may have a thickness of, e.g., about 10 nm to about 100 nm. In an implementation, the transfer layer may have a thickness of about 30 nm to about 70 nm.

The thermal transfer film may have a thickness of, e.g., about 30 μm to about 300 μm. In an implementation, the thermal transfer film may have a thickness of about 85 μm to about 130 μm.

Another embodiment provides an organic electroluminescent display manufactured using the thermal transfer film.

The thermal transfer film may be used as a donor film in manufacture of the organic electroluminescent display. For example, a suitable method may be used to manufacture an organic electroluminescent display using the same. For example, the organic electroluminescent display may be manufactured by preparing a substrate (on which an anode, a hole transport layer, and a hole injection layer are stacked); preparing a donor film having an emitting layer (EML) formed thereon by stacking an organic electroluminescent material on a thermal transfer film; laminating the substrate and the donor film; patterning using a laser beam; and stacking an electron transport layer, an electron injection layer, and a cathode.

For example, the anode may be formed on a transparent substrate for the organic electroluminescent display, and the hole transport layer (HTL) and the hole injection layer (HIL) may be deposited thereon. The transparent substrate may be subjected to cleaning before forming the anode. The anode may include, e.g., indium tin oxide (ITO), indium zinc oxide (IZO), or the like.

The donor film (having the emitting layer) may be manufactured by depositing R, G and B organic electroluminescent materials on the thermal transfer film.

After laminating the donor film and the transparent substrate (on which the HIL and HTL are deposited), laser irradiation may be performed. Upon laser irradiation, the LTHC layer of the donor film absorbs and converts light into thermal energy, thereby causing volume expansion. As a result, the organic electroluminescent materials stacked on the LTHC layer may be transferred to the substrate, thereby forming a patterned organic electroluminescent layer. Then, the donor film may be peeled off, followed by sequentially stacking an electron transporting layer (ETL), an electron injection layer (EIL), and a cathode, thereby providing an organic electroluminescent display.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparative Example 1

To a mixture of 47.15 g of methylethylketone and 26.05 g of propylene glycol monomethyl ether acetate as a solvent, 17.99 g of a hexa-functional polyurethane acrylate oligomer (CN9006, Sartomer Co., Ltd.) as a UV-curable resin, 7.44 g of a tri-functional acrylate monomer (SR351, Sartomer Co., Ltd.) as a polyfunctional monomer, and 0.62 g of 1H,1H,10H, 10H-perfluoro-1-10 decyl diacrylate (Exfluor Research Corporation) as a UV-curable fluorine compound were added and stirred for 30 minutes. Then, 0.75 g of a photopolymerization initiator (Irgacure 184, CIBA Co., Ltd.) was added to the mixture, followed by stirring for 30 minutes, thereby preparing a composition.

Preparative Example 2

To a mixture of 47.15 g of methylethylketone and 26.05 g of propylene glycol monomethyl ether acetate as a solvent, 17.99 g of a hexa-functional polyurethane acrylate oligomer (CN9006, Sartomer Co., Ltd.) as a UV-curable resin, 7.44 g of a tri-functional acrylate monomer (SR351, Sartomer Co., Ltd.) as a polyfunctional monomer, and 0.62 g of acryl group-containing polyether modified dimethylpolysiloxane (BYK3700, BYK Chemie Co., Ltd.) as a UV-curable curable siloxane compound were added and stirred for 30 minutes. Then, 0.75 g of a photopolymerization initiator (Irgacure 184, CIBA Co., Ltd.) was added to the mixture, followed by stirring for 30 minutes, thereby preparing a composition.

Preparative Example 3

To a mixture of 63.38 g of methylethylketone and 34.33 g of propylene glycol monomethyl ether acetate as a solvent, 1.53 g of a fluorinated acrylate oligomer (Optool AR-110, Daikin Co., Ltd.) as a UV-curable resin, and 0.69 g of 1H,1H, 10H,10H-perfluoro-1-10 decyl diacrylate (Exfluor Research Corporation) as a UV-curable fluorine compound were added and stirred for 30 minutes. Then, 0.07 g of a photopolymerization initiator (Irgacure 184, CIBA Co., Ltd.) was added to the mixture, followed by stirring for 30 minutes, thereby preparing a composition.

Example 1

25 g of polymethyl (meth)acrylate and 40 g of an epoxy acrylate binder as UV-curable resins, 17 g of a tri-functional acrylate monomer (SR351, Sartomer Co., Ltd.) as a polyfunctional monomer, and 3 g of a photopolymerization initiator (Irgacure 184, CIBA Co., Ltd.) were mixed to prepare a binder mixture. 15 g of carbon black was added to the binder mixture, followed by stirring for 30 minutes, thereby preparing a composition for an LTHC layer.

The composition for the LTHC layer was coated on a 100 μm thick PET film (A4100, Toyobo Co., Ltd.) as a base layer, using a bar coater, followed by drying a 80° C. for 2 minutes to form a 3.0 μm thick LTHC layer on the base layer.

On the LTHC layer, the composition prepared in Preparative Example 1 was deposited using a wired bar coater No. 7, followed by drying in an oven at 80° C. for 2 minutes. Then, the coating was cured at 300 mJ/cm² under a nitrogen atmosphere, thereby providing a thermal transfer film having the structure as shown in FIG. 2. For example, an inter layer (wherein a transfer enhancement layer is formed at the surface layer of the inter layer) may have a thickness of about 2 μm to about 3 μm and may be formed on the LTHC layer.

Example 2

The thermal transfer film having a 2~3 μm thick inter layer was prepared in the same manner as in Example 1 except that the composition prepared in Preparative Example 2 was used instead of the composition of Preparative Example 1.

Example 3

A 3.0 μm thick LTHC layer was formed on the base layer in the same manner as in Example 1.

A composition for a coating layer that does not contain the UV-curable fluorine compound of the composition of Preparative Example 1 was prepared. The prepared composition was deposited on the LTHC layer using a wired bar coater No. 7, followed by drying a 80° C. for 2 minutes to form a 2.5 μm thick inter layer.

On the inter layer, the composition for the transfer enhancement layer prepared in Preparative Example 3 was deposited using a wired bar coater No. 4, followed by drying in an oven at 80° C. for 2 minutes. Then, the coating was cured at 300 mJ/cm² under a nitrogen atmosphere, thereby providing a thermal transfer film having the structure as shown in FIG. 4. The thermal transfer film had a 100 nm thick transfer enhancement layer.

Example 4

14.51 g of polymethyl (meth)acrylate and 41.28 g of an epoxy acrylate binder as UV-curable resins, 27.62 g of a tri-functional acrylate monomer (SR351, Sartomer Co., Ltd.) as a polyfunctional monomer, 2.49 g of 1H,1H,10H,10H-perfluoro-1-10 decyl diacrylate (Exfluor Research Corporation) as a UV-curable fluorine compound, and 2.55 g of a photopolymerization initiator (Irgacure 184, CIBA Co., Ltd.) were mixed to prepare a binder mixture. 11.55 g of carbon black was added to the binder mixture, followed by stirring for 30 minutes, thereby preparing a composition.

The composition was coated on a 100 μm thick PET film (A4100, Toyobo Co., Ltd.) as a base layer, using a bar coater, followed by drying a 80° C. for 2 minutes to form a 3.0 μm thick LTHC layer having the structure of FIG. 1 on the base layer.

Comparative Example 1

A 2-3 μm thick inter layer was formed in the same manner as in Example 1 except that a composition not containing the UV-curable fluorine compound of the composition prepared in Preparative Example 1 was used.

Each of the thermal transfer films prepared in the Examples and the Comparative Example was evaluated as to surface energy, water contact angle, n-hexadecane contact angle and peel strength, and the results are shown in Table 1, below.

Evaluation of Physical Properties (1) Surface energy: Contact angle was measured using a Phoenix300 Contact Angle Analyzer (SEQ Co., Ltd.). Then, the surface energy was calculated by applying the Girifalco-Good-Fowkes-Young equation to the contact angle.

(2) Water contact angle: A water droplet was dropped from a height of 1 cm onto the transfer enhancement layer, and the contact angles between the transfer enhancement layer and the water droplet were measured three times using a Phoenix 300 (CEO Co., Ltd.). An average value of the contact angles was obtained.

(3) n-hexadecane contact angle: An n-hexadecane droplet was dropped from a height of 1 cm on the transfer enhancement layer, and the contact angles between the transfer enhancement layer and the n-hexadecane droplet were measured three times using a Phoenix 300 (CEO Co., Ltd.). An average value of the contact angles was obtained.

(4) Peel strength: A 25 mm wide adhesive strength evaluation tape (Nitto Tape 31D) was attached to a 30 cm wide transfer enhancement layer using a roller at a load of 10 kgf, and was left for 3 days at 25° C. Then, the peel strength of the specimen was measured using a 14FW Tester (Heidon) at a peeling speed of 300 mm/min and a peeling angle of 180°. A peel strength of 600 gf/inch or less indicates satisfactory transfer of the organic electroluminescent materials, and a peel strength of more than 600 gf/inch indicates unsatisfactory transfer of the organic electroluminescent materials.

TABLE 1

|  | Example | | | | Comparative Example |
|---|---|---|---|---|---|
|  | 1 | 2 | 3 | 4 | 1 |
| Surface energy (dyne/cm) | 15 | 18 | 14 | 16 | 36 |
| Water contact angle (°) | 100 | 95 | 103 | 99 | 73 |
| n-hexadecane contact angle (°) | 55 | 35 | 54 | 55 | 8 |
| Peel strength (gf/inch) | 215 | 470 | 245 | 228 | 905 |

As may be seen in Table 1, the thermal transfer film according to the embodiments provided satisfactory transfer of the organic electroluminescent materials, without tearing, at a peel strength of 600 gf/inch or less upon patterning and removal of the thermal transfer film.

By way of summation and review, a laser-induced thermal imaging method may include a process of peeling a thermal transfer film after stacking, thermally transferring, and patterning an organic electroluminescent material and a substrate, e.g., a pixel defining layer (PDL) on the thermal transfer film. In the peeling process, if adhesive strength between the organic electroluminescent material and the thermal transfer film is equal to or stronger than the adhesive strength between the organic electroluminescent material and the substrate, the organic electroluminescent material may be partially or wholly peeled off, and thus may not be completely transferred to the substrate. Such a peeling-off phenomenon can decrease thermal-transfer efficiency and may cause a dead pixel, thereby lowering yield.

The embodiments provide a thermal transfer film, which can lower surface energy of a contact surface on which a transfer layer including an organic electroluminescent material is stacked, thus reducing the likelihood of and/or preventing the organic electroluminescent material from peeling off when the thermal transfer film is removed (peeling process) after patterning by the thermal transfer film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thermal transfer film, comprising:
a base layer;
a transfer enhancement layer having a surface energy of about 25 dyne/cm or less;
an additional layer provided between the base layer and the transfer enhancement layer, the transfer enhancement layer having an interface with the additional layer, and a surface energy of the additional layer being higher than the surface energy of the transfer enhancement layer; and
a transfer layer stacked on the transfer enhancement layer, the transfer layer including an organic electroluminescent material layer.

2. The thermal transfer film as claimed in claim 1, wherein the transfer enhancement layer has a peel strength of about 600 gf/inch or less.

3. The thermal transfer film as claimed in claim 1, wherein the transfer enhancement layer has a water contact angle of about 80° or more.

4. The thermal transfer film as claimed in claim 1, wherein the transfer enhancement layer has an n-hexadecane contact angle of about 25° or more.

5. The thermal transfer film as claimed in claim 1, wherein the transfer enhancement layer has a thickness of about 0.1 nm to about 10,000 nm.

6. The thermal transfer film as claimed in claim 1, wherein an adhesive strength between the thermal transfer film and the organic electroluminescent material is lowered by the presence of the transfer enhancement layer.

7. A thermal transfer film, comprising:
a base layer;
a transfer enhancement layer having a surface energy of about 25 dyne/cm or less; and
an additional layer provided between the base layer and the transfer enhancement layer, the transfer enhancement layer having an interface with the additional layer, and a surface energy of the additional layer being higher than the surface energy of the transfer enhancement layer,
wherein the transfer enhancement layer is prepared from a composition including a UV-curable fluorine compound, a UV-curable siloxane compound, or a mixture thereof.

8. The thermal transfer film as claimed in claim 7, wherein the UV-curable fluorine compound includes a compound represented by Formula 1:

$$(CH_2=CR^1COO)_n R^f,$$ [Formula 1]

wherein, in Formula 1, n is an integer of 1 or more; $R^1$ is hydrogen or a $C_1$ to $C_5$ straight or branched alkyl group; and $R^f$ is a fluoroalkyl group, a fluoroalkylene group, a perfluoroalkyl group, or a perfluoroalkylene group, and
wherein the UV-curable siloxane compound includes a (meth)acrylic group-containing polyether-modified dialkyl polysiloxane.

9. A thermal transfer film, comprising:
a base layer;
a transfer enhancement layer having a surface energy of about 25 dyne/cm or less; and
an additional layer provided between the base layer and the transfer enhancement layer, the transfer enhancement layer having an interface with the additional layer, and a surface energy of the additional layer being higher than the surface energy of the transfer enhancement layer, wherein the additional layer is a light-to-heat conversion (LTHC) layer, the transfer enhancement layer being in the LTHC layer at a surface of the LTHC layer.

10. The thermal transfer film as claimed in claim 9, wherein the transfer enhancement layer and the LTHC layer have a monolayer structure formed by migration of components from the same composition to the respective layers.

11. The thermal transfer film as claimed in claim 10, wherein the composition includes:
a UV-curable resin,
a polyfunctional monomer,
a photopolymerization initiator,
a light-to-heat conversion material, and
at least one of a UV-curable fluorine compound or a UV-curable siloxane compound.

12. The thermal transfer film as claimed in claim 10, wherein the composition includes, in terms of solid content:
about 25 wt % to about 80 wt % of a UV-curable resin,
about 10 wt % to about 40 wt % of a polyfunctional monomer,
about 5 wt % to about 30 wt % of a light-to-heat conversion material,
about 0.1 wt % to about 10 wt % of a photopolymerization initiator, and
about 0.1 wt % to about 5.0 wt % of at least one of a curable fluorine compound or a curable siloxane compound.

13. A thermal transfer film, comprising:
a base layer;
a transfer enhancement layer having a surface energy of about 25 dyne/cm or less; and
an additional layer provided between the base layer and the transfer enhancement layer, the transfer enhancement layer having an interface with the additional layer, and a surface energy of the additional layer being higher than the surface energy of the transfer enhancement layer, further comprising a LTHC layer, wherein the additional layer is an inter layer, the transfer enhancement layer being in the inter layer at a surface layer of the inter layer, the LTHC layer being between the inter layer and the base layer.

14. The thermal transfer film as claimed in claim 13, wherein the transfer enhancement layer and the inter layer have a monolayer structure formed by migration of components from the same composition to the respective layers.

15. The thermal transfer film as claimed in claim 14, wherein the composition includes:
    a UV-curable resin,
    a polyfunctional monomer,
    a photopolymerization initiator, and
    at least one of a UV-curable fluorine compound or a UV-curable siloxane compound.

16. The thermal transfer film as claimed in claim 14, wherein the composition includes, in terms of solid content:
    about 40 wt % to about 80 wt % of a UV-curable resin,
    about 10 wt % to about 50 wt % of a polyfunctional monomer,
    about 1 wt % to about 10 wt % of a photopolymerization initiator, and
    about 0.1 wt % to about 5.0 wt % of at least one of a curable fluorine compound or a curable siloxane compound.

17. A thermal transfer film, comprising:
    a base layer;
    a transfer enhancement layer having a surface energy of about 25 dyne/cm or less; and
    an additional layer provided between the base layer and the transfer enhancement layer, the transfer enhancement layer having an interface with the additional layer, and a surface energy of the additional layer being higher than the surface energy of the transfer enhancement layer, wherein the additional layer includes at least one of an LTHC layer or an inter layer, the transfer enhancement layer being stacked separately on the additional layer.

18. The thermal transfer film as claimed in claim 17, wherein the transfer enhancement layer is prepared from a composition including:
    a fluorine modified UV-curable resin,
    photopolymerization initiator, and
    at least one of a UV-curable fluorine compound or a UV-curable siloxane compound.

19. The thermal transfer film as claimed in claim 17, wherein the transfer enhancement layer is prepared from a composition including, in terms of solid content:
    about 50 wt % to about 80 wt % of a fluorine modified UV-curable resin,
    about 1 wt % to about 10 wt % of a photopolymerization initiator, and
    about 19 wt % to about 40 wt % of a curable fluorine compound.

* * * * *